United States Patent [19]

Tabushi

[11] Patent Number: 4,807,187
[45] Date of Patent: Feb. 21, 1989

[54] METHOD AND DEVICE OF MEMORY USING LIQUID CRYSTAL

[75] Inventor: Iwao Tabushi, Kyoto, Japan

[73] Assignee: Kureha Kagaku Kogyo Kabushiki Kaisha, Tokyo, Japan

[21] Appl. No.: 22,692

[22] Filed: Mar. 6, 1987

[30] Foreign Application Priority Data

Mar. 7, 1986 [JP] Japan .................................. 61-50221

[51] Int. Cl.$^4$ .............................................. G11C 13/04
[52] U.S. Cl. ................................. 365/108; 350/350 R
[58] Field of Search ........................... 350/357, 350 R; 340/784, 785; 365/108

[56] References Cited

U.S. PATENT DOCUMENTS

| | | |
|---|---|---|
| 3,652,149 | 3/1972 | Rogers .................. 350/357 |
| 3,712,709 | 1/1973 | Kenworthy ............. 350/357 |
| 3,854,794 | 12/1974 | Van Dam et al. ....... 350/357 |
| 4,088,393 | 5/1978 | Hirano .................. 350/350 R |
| 4,300,138 | 11/1981 | Nakauchi et al. ...... 350/357 X |

FOREIGN PATENT DOCUMENTS 54-143783  11/1979  Japan .
57-137814   8/1982  Japan .

Primary Examiner—Joseph A. Popek
Attorney, Agent, or Firm—Armstrong, Nikaido, Marmelstein & Kubovcik

[57] ABSTRACT

A memory comprises a viologen which shows liquid crystalline properties, and a voltage more than 0.7 V is applied to the viologen so that the electric conductivity of the viologen is changed and the resultant state of said viologen in which the electric conductivity has been changed is used as a memorized state.

15 Claims, 1 Drawing Sheet

METHOD AND DEVICE OF MEMORY USING LIQUID CRYSTAL

BACKGROUND OF THE INVENTION

1. Field of the Invention

This invention relates to a new method of memory using liquid crystal and also to a new memory device.

2. Description of the Prior Art

Memory devices such as devices using magnetic mediums, devices utilizing photomagnetic effect, semiconductor memories, etc. have been well-known. Any of those conventional devices is, however, relatively complicated in construction and troublesome in its manufacturing. Those devices also have disadvantages that they are apt to be influenced by electromagnetic noises.

SUMMARY OF THE INVENTION

Accordingly, it is an object of the present invention to provide a means of memory which is substantially free from influence of electromagnetic noises.

It is another object of the present invention to provide a memory device having relatively simple construction.

The above and other objects can be attained by the present invention as follows.

In the present invention, a voltage more than 0.7 V is applied to a liquid crystalline viologen to change the electric conductivity thereof and the resultant state of the viologen in which the electric conductivity has been changed is used as a memorized state.

A memory device according to the present invention comprises a pair of electrodes between which a liquid crystalline viologen is disposed, and writing means and reading means which are electrically connected to the electrodes.

Other and further objects, features and advantages of the invention will appear more fully from the following description.

DETAILED DESCRIPTION

Figure 1:
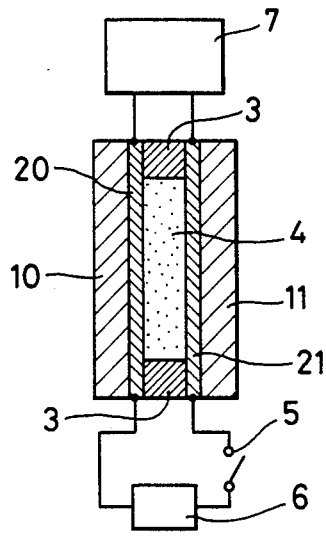
FIG. 1 is a cross-sectional view of a memory device according to an embodiment of the invention.

Referring first to FIG. 1, a memory device according to the invention will be described.

A pair of electrodes 20 and 21 are formed on a pair of base plates 10 and 11, respectively. Although base plates are not always required, in case of using them, glass plates or monocrystalline silicon plates provided with electroconductive oxide layers thereon as electrodes 20 and 21, such as nesaglass, can be used. Of course, metal can be used for electrodes 20 and 21.

Electrodes 20 and 21 are arranged in parallel with each other, between which a ring-shaped insulation spacer 3 made of, for example, Teflon (trademark) is disposed. The inside space defined by electrodes 20 and 21 and spacer 3 is filled by a liquid crystalline viologen 4. The distance between electrodes 20 and 21 is, for example, 120 μm.

Electrodes 20 and 21 are connected to a power source 6 through a switch 5 which operates in accordance with the aim of the device. For example, if the device is equipped in an electric machine to be used for memorizing an occurrence of or the duration of a power failure, switch 5 is closed only while the power failure occurs. If the device is used for memorizing the magnitude of voltage applied, instead of power source 6, a power generator to be measured is connected to electrodes 20 and 21 through switch 5 or directly.

Electrodes 20 and 21 are connected to a detection circuit 7 which detects the state of liquid crystalline viologen 4, for example, the specific resistance thereof. On the basis of the detection, a message may be displayed on a control panel (not shown).

Liquid crystalline viologen 4 is preferably a halide of viologen (compound of N-substituted dipyridyl). For example, N,N'-bis(3,6,9-trioxatridecyl)-4,4'-dipyridinium diiodide, N,N'-bis(3,6,9,12-tetraoxadecyl)-4,4'-dipyridinium diiodide, N,N'-bis(3,6,9-trioxatridecyl)-4,4'-dipyridinium dibromide or the like are preferably used.

Viologen used in the present invention must show liquid crystalline properties. Viologen without liquid crystalline properties is useless because the electric conductivity thereof does not change even when a voltage is applied or, even if its electric conductivity changes, it cannot keep the state of conductivity changed.

In the present invention, the term "liquid crystalline" is used for meaning not only a liquid crystalline state in its original meaning but also a sintering state in which liquid crystalline properties are maintained.

Hereinbelow, examples of the invention will be described.

EXAMPLE 1

A memory device as shown in FIG. 1 was prepared by the use of N,N'-bis(3,6,9-trioxatridecyl)-4,4'-dipyridinium diiodide as liquid crystalline viologen 4, which has the following structural formula.

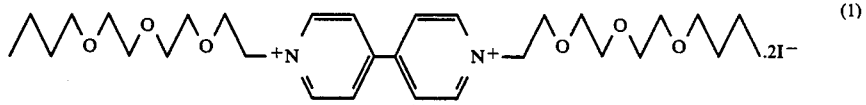

(1)

This compound can be made, for example, by the way that one mole of 4,4'-dipyridyl and two moles of 3,6,9-trioxatridecyl iodide are dissolved in acetonitrile to react at 80° C. for 24 hours.

The transition of this compound from solid state into smectic liquid crystalline high-ordered state occurs at 73° C. in general. However, in the case that the compound is reconstituted from liquid crystalline state into solid state in a temperature descending process and then it is again converted from solid state into liquid crystalline state, the latter transition occurs at 25° C. In contrast to this, the transition from liquid crystalline state into solid state occurs at 18° C. without reference to its hysteresis. The transition between liquid crystalline state and melting state occurs at 219° C.

When switch 5 of the memory device shown in FIG. 1 was closed to apply a voltage of 30 V for 2.6 minutes from power source 6 to liquid crystalline viologen 4, the specific resistance of the latter changed from $2 \times 10^7$ Ωcm to $1 \times 10^3$ Ωcm, that is, more than $10^4$ times. The temperature of liquid crystalline viologen 4 upon applying the voltage was 110° C. and the viologen showed liquid crystalline properties enough.

After stopping the application of the voltage, although the memory device was left at room temperature in argon atmosphere for 3 days, it kept the high conductivity state in which the specific resistance is low.

Figure 2:
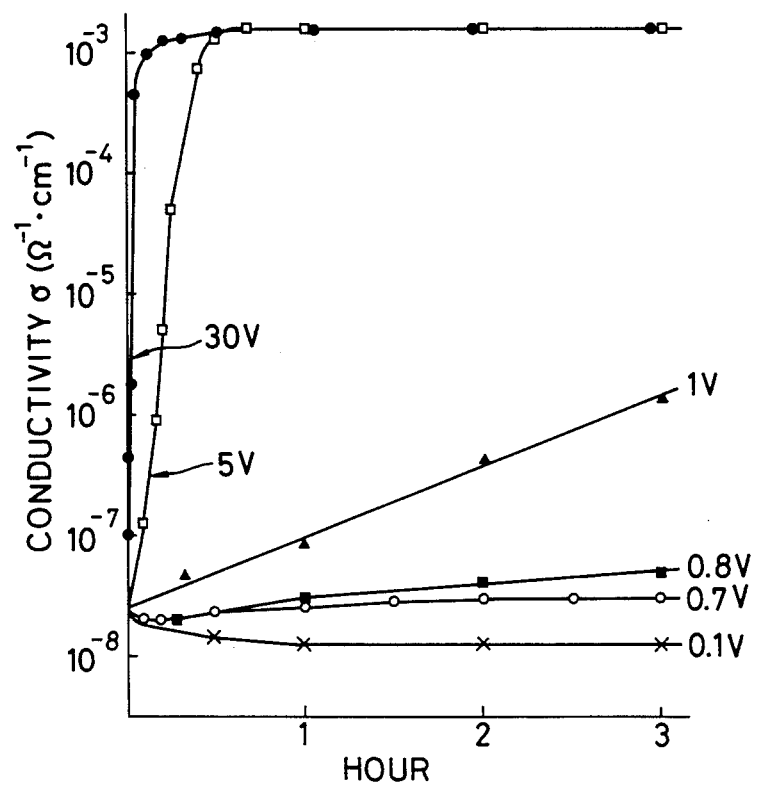
FIG. 2 is a graph showing changes of the electric conductivity of a liquid crystalline viologen in relation to voltages applied and hours.

When the magnitude of voltage applied is varied, relationships between the applying time and the change of the electric conductivity σ of the memory device are given in FIG. 2. As apparent from FIG. 2, when a voltage more than 0.7 V is applied, the electric conductivity of the device increases in accordance with the applying time. In particular, when a voltage more than 5 V is applied, the electric conductivity increases steeply in a relatively short time.

Therefore, the memory device is expected for the following uses.

First, the device is changed between the low conductivity state and the high conductivity state by applying a pulse of voltage more than 5 V, preferably more than 30 V and it is detected whether the device is at the low conductivity state or at the high conductivity state. This is a digital memory method.

Second, a constant voltage below 5 V, preferably near 1 V is applied to the device and the change of the electric conductivity is measured to detect the applying time of the voltage. In this case, even if the voltage is applied discontinuously, the total time of applying the voltage can be detected.

Moreover, in comparison with the liquid crystalline state, the required time for reaching the same or similar value of the electric resistance is short, providing good results.

In the memory device shown in FIG. 1, liquid crystalline viologen 4 may be formed by pressure forming with electrodes 20 and 21. Alternatively, it may be made by any well-known forming or coating technique such as an applying method, a casting method, a method with a blending of dispersing agent, a vacuum evaporation method, and an electrochemical method.

In an example of applying method, chloroform solution of the above-described compound (1) was applied on electrodes of gold each of which had the thickness of 2000 Å, the length of 2 mm and the width of 20 μm and has been formed on a monocrystalline silicon substrate. The gap between the electrodes was 10 μm. When an electric stimulus of 1 V was applied to this device for 2 minutes at 110° C., the electric resistance decreased from about $10^6$ Ωcm to about $5 \times 10^3$ Ωcm, that is, the electric conductivity increased about 200 times.

As a modification of this memory device, each of the electrodes which sandwiches a liquid crystalline viologen consists of a matrix of needle electrodes and only a desired pattern of needle electrodes is driven so that the electric resistance of only the desired pattern of the liquid crystalline viologen is decreased. This device may be used as an electric connector which makes a connection only in a predetermined pattern.

EXAMPLE 2

N,N'-bis(3,6,9-trioxatridecyl)-4,4'-dipyridinium dibromide was used, which has the following structural formula.

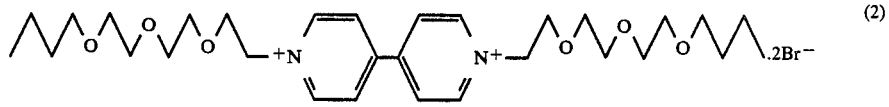

The values of voltage to be applied in the above methods, are independent of the thickness of liquid crystalline viologen 4.

The specific resistance $2 \times 10^7$ Ωcm of this material (1) without the abovedescribed electric stimulus is extremely high, similarly to, for example, the specific resistance $10^9$ Ωcm (50°–90° C.) to $10^5$ Ωcm (70°–130° C.) of quaternary ammonium salt of long-chained alkyl diaza-bicyclo [2,2,2] octane halide which is well-known as an ionic conductor. Even when the material (1) is at smectic liquid crystalline state with high viscosity, if the above-described electric stimulus is not applied, it has such a high electric resistance.

At solid state, which means the state that the transition into liquid crystalline state due to heat has not occurred, an electric stimulus similar to that at the above-described liquid crystalline state to this material (1) does not cause any decrease of its electric resistance. For example, the specific resistance of this material at 25° to 30° C. is nearly $10^{11}$ Ωcm which is extremely high, and even when electric stimuli of 0 to 30 V were applied to this material, any decrease of the specific resistance was not observed at all.

In contrast to this, at a sintering state in which liquid crystalline properties are maintained, an electric stimulus similar to that at the above-described liquid crystalline state caused a remarkable decrease of the electric resistance similarly to that at liquid crystalline state.

This compound is liquid crystalline from room temperature to 200° C. (decomposed). The consistent liquid crystal of this material was sandwiched by a pair of transparent electrodes with a Teflon spacer of 0.1 mm so that the electric conductivity was measured. When a voltage of 30 V is applied at 110° C., the electric conductivity increased from $5 \times 10^{-9}$ Ω$^{-1}$ cm$^{-1}$ to about $10^{-5}$ Ω$^{-1}$ cm$^{-1}$.

Each transparent electrode consisted of 95% In$_2$O$_3$ and 5% SnO$_2$ and had the surface resistance of 10Ω.

The measurement of the electric conductivity was effected as follows. The device was set in a measurement cell, which was decompressed for 2 hours (up to 0.1 mmHg within liq.N$_2$). Subsequently, the atmosphere in the measurement cell was replaced by argon gas dried with P$_2$O$_5$ and then the device was left under the presence of P$_2$O$_5$ for 2.5 hours (vapor pressure $2 \times 10^{-5}$ mg/l). The device was heated at a constant temperature by a hot plate of 110° C. and voltage values and current values at several points between 1 V and 100 V were recorded.

The electric conductivity σ was calculated by the following equation (the same in Example 1 and the following Comparative Examples 1 through 3).

$$\sigma = \frac{I \cdot l}{V \cdot A}$$

$\sigma$: electric conductivity ($\Omega^{-1}$ cm$^{-1}$)
I: current (A)
l: thickness of sample (cm)
V: voltage (V)
A: area of sample (cm$^3$)

COMPARATIVE EXAMPLE 1

A device similar to that of Example 2 was prepared by the use of the following material.

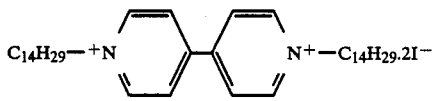
(3)

Because this material was not liquid crystalline but solid, a sample thereof was pressed at 400 kg/cm$^2$ for 5 minutes by a tableting machine into a pellet with the thickness of 0.17 to 0.19 mm and the area of about 2 mm×2 mm. The pellet was sandwiched by a pair of transparent electrodes with a Teflon spacer of 0.1 mm and the device was fixed on a hot plate with clips.

Although the electric conductivity $\sigma$ was measured similarly to that of Example 2, it did not substantially change even when electric stimuli were applied (132° C.: $1 \times 10^{-10}$ to $3 \times 10^{-11}$ $\Omega^{-1}$ cm$^{-1}$).

COMPARATIVE EXAMPLE 2

Similarly to Comparative Example 1, a pellet was prepared by the use of the following material.

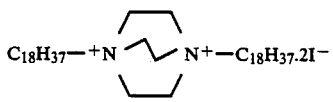
(4)

The pellet was sandwiched by a pair of transparent electrodes similarly to that of Comparative Example 1.

The temperature was fixed at 30° C. and the current was measured at a voltage of 10 V, resulting about 100 pA ($\sigma = 5 \times 10^{-12}$ $\Omega^{-1}$ cm$^{-1}$). Similar measurements were effected at several points up to 150° C. The result is given in the following table 1. No change of the electric conductivity due to electric stimuli was observed.

TABLE 1

| Temperature (°C.) | $\sigma$ |
| --- | --- |
| 30 to 70 | $5 \times 10^{-12}$ $\Omega^{-1}$cm$^{-1}$ |
| 130 to 160 | $2 \times 10^{-7}$ $\Omega^{-1}$cm$^{-1}$ |

COMPARATIVE EXAMPLE 3

Similarly to Comparative Example 2, a pellet was prepared by the use of the following material.

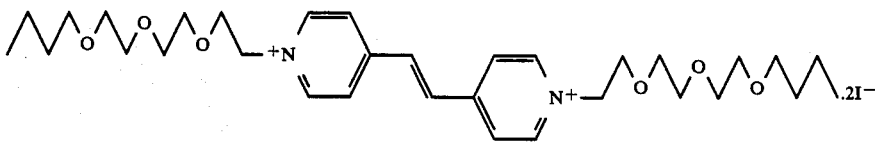
(5)

This material was solid at 132° C.

The measurements were effect at fixed temperatures 26° C. and 110° C. with a voltage of 30 V. No change of the electric conductivity due to electric stimuli was observed.

TABLE 2

| Temperature | $\sigma$ |
| --- | --- |
| 26° C. | $5 \times 10^{-13}$ $\Omega^{-1}$cm$^{-1}$ |
| 110° C. | $1 \times 10^{-12}$ $\Omega^{-1}$cm$^{-1}$ |

As many apparently widely different embodiments of this invention may be made without departing from the spirit and scope thereof, it is to be understood that the invention is not limited to the specific embodiments thereof except as defined in the appended claims.

What is claimed is:
1. A memory method comprising:
   (a) arranging a voltage sensitive element consisting of a viologen which has liquid crystalline properties between a pair of electrodes so that a voltage may be applied thereto;
   (b) applying to said electrodes a voltage sufficient to change electric conductivity of said voltage sensitive viologen element from a first state to a second state; and
   (c) measuring the electric conductivity state of said element, a measurement indicating said first conductivity state representing a first memory state and a measurement indicating said second conductivity state representing a second memory state.
2. A method according to claim 1, wherein said viologen is a halide of viologen.
3. A method according to claim 2, wherein said viologen is one selected from N,N'-bis(3,6,9-trioxatridecyl)-4,4'-dipyridinium diiodide, N,N'-bis(3,6,9,12-tetraoxadecyl)-4,4'-dipyridinium diiodide and N,N'-bis(3,6,9-trioxatridecyl)-4,4'-dipyridinium dibromide.
4. A method according to claim 1, wherein said viologen is at liquid crystalline state.
5. A method according to claim 1, wherein said viologen is at sintering state in which liquid crystalline properties are maintained.
6. A memory method according to claim 1, wherein said first conductivity state is a low conductivity state, said second conductivity state is a conductivity state of substantially higher conductivity than said low conductivity state, and said applied voltage is of a level such as to change electric conductivity of said viologen rapidly between said first and second conductivity states.
7. A memory method as recited in claim 6 where said applied voltage is more than 5 V.
8. A memory method according to claim 1 wherein said first conductivity state is a low conductivity state, said voltage applied to said electrodes is of a level such as to change the low conductivity state of said element to a second conductivity state of substantially higher conductivity over a substantial period of time, and said measurement of electric conductivity of said second conductivity state is representative of the length of time said voltage is applied to said electrodes.

9. A memory method as recited in claim 8 wherein said applied voltage is between 0.7 V and 5 V.

10. A memory method as recited in claim 1 wherein said applied voltage is more than 0.7 V.

11. A memory device comprising:
a pair of electrode means;
a viologen having liquid crystalline properties disposed between said electrode means in constant contact therewith;
condition sensing means connected to said electrodes for applying a voltage to said electrode means upon occurrence of a condition, such that an electrical conductive state of said viologen is changed by application of said voltage to store in memory an indication of occurrence of said condition; and
detecting means connected to said electrode means for measuring a change in the electrical conductive state of said viologen as representing occurrence of said condition.

12. A memory device according to claim 11, wherein said viologen is a halide of viologen.

13. A memory device according to claim 12, wherein said viologen is one selected from N,N'-bis(3,6,9-trioxatridecyl)-4,4'-dipyridinium diiodide, N,N'-bis(3,6,9,12-tetraoxadecyl)-4,4'-dipyridinium diiodide and N,N'-bis(3,6,9-trioxatridecyl)-4,4'-dipyridinium dibromide.

14. A memory device according to claim 11, wherein said condition is the magnitude of voltage applied, and a source of voltage to be measured is connected to said electrodes.

15. A memory device as recited in claim 11, wherein said condition is one of an occurrence of a power failure and a duration of a power failure in an electric machine, and said voltage is applied to said electrode means only during the time said power failure occurs.

* * * * *